United States Patent [19]

Omata et al.

[11] Patent Number: 5,212,121

[45] Date of Patent: May 18, 1993

[54] RAW BATCHES FOR CERAMIC SUBSTRATES, SUBSTRATES PRODUCED FROM THE RAW BATCHES, AND PRODUCTION PROCESS OF THE SUBSTRATES

[75] Inventors: Takahisa Omata, Ayase; Masaru Yanagimachi, Tochigi; Tosio Matsuuchi, Tochigi; Yoshinori Koyanagi, Tochigi, all of Japan

[73] Assignee: Mitsui Mining Company, Limited, Tokyo, Japan

[21] Appl. No.: 899,938

[22] Filed: Jun. 17, 1992

Related U.S. Application Data

[63] Continuation of Ser. No. 711,899, Jun. 7, 1991, abandoned.

[30] Foreign Application Priority Data

Jun. 13, 1990 [JP] Japan ................................. 2-152608
Nov. 29, 1990 [JP] Japan ................................. 2-326073

[51] Int. Cl.$^5$ ...................... C03C 3/091; C03C 14/00
[52] U.S. Cl. .......................... 501/32; 501/17; 501/65; 501/66; 501/92
[58] Field of Search ................ 501/17, 32, 65, 66, 501/92

[56] References Cited

U.S. PATENT DOCUMENTS

| | | | |
|---|---|---|---|
| 4,624,934 | 11/1966 | Kokubu et al. | 501/17 |
| 4,755,490 | 7/1988 | DiLazzaro | 501/32 X |
| 4,849,379 | 7/1989 | McCormik | 501/32 X |
| 4,849,380 | 7/1989 | Sawhill | 501/32 X |
| 4,985,222 | 1/1991 | Hata et al. | 501/95 X |

FOREIGN PATENT DOCUMENTS

| | | |
|---|---|---|
| 0103075 | 6/1985 | Japan ................................. 501/12 |
| 62-138357 | 6/1987 | Japan . |
| 63-64957 | 3/1988 | Japan . |
| 63-74957 | 4/1988 | Japan . |
| 1-95402 | 4/1989 | Japan . |

*Primary Examiner*—Karl Group
*Attorney, Agent, or Firm*—Fisher, Christen & Sabol

[57] ABSTRACT

This invention is concerned with ceramic substrates for multilayer interconnection. This invention is also concerned with a raw batch for ceramic substrates which require a calcining temperature as low as 1,000° C. or lower upon their production, are low in dielectric constant and have a coefficient of thermal expansion close to that of silicon and also with a process for the production of the substrates. This invention makes use of a raw batch which permits the use of a low resistance conductor such as Ag-Pd, Ag, Au or Cu and also the production of substrates by low-temperature calcination. The raw batch contains borosilicate silicate glass powder, and aluminum borate powder and at a weight ratio of 40-80 percent to 20-60 percent. The raw batch can additionally contain one or more specific oxides in particular proportions.

7 Claims, No Drawings

RAW BATCHES FOR CERAMIC SUBSTRATES, SUBSTRATES PRODUCED FROM THE RAW BATCHES, AND PRODUCTION PROCESS OF THE SUBSTRATES

This application is a continuation of prior U.S. application Ser. No. 07/711,899, filed on Jun. 7, 1991, now abandoned.

BACKGROUND OF THE INVENTION

1) Field of the Invention

The present invention relates to raw batches for ceramic substrates useful for multilayer interconnection to arrange and mount semiconductor elements, especially LSIs thereon, and particularly to raw batches for ceramic substrates which can be calcined at a temperature lower than the calcining temperature employed upon production of alumina-base substrates, specifically at a low temperature not higher than 1,000° C., are low in dielectric constant and have a coefficient of thermal expansion close to that of silicon. The present invention is also concerned with substrates produced from the raw batches and further with a process for the production of the substrates.

b) Description of the Related Art

Speedup of an LSI generally requires a higher signal propagation velocity. To achieve this, it is necessary to lower the dielectric constant as a property of a substrate itself. Further, reduction of the rate of occurrence of connection failure between wiring paths on the substrate and semiconductor elements requires the provision of a substrate whose coefficient of thermal expansion is close to those of the semiconductor elements. On the other hand, processes have been known for the production of ceramic substrates with a built-in, three-dimensional interconnection. According to these processes, sheet-like substrates with a wiring metal provided by printing or the like are laminated and then calcined into an integral body.

As a raw material for the production of substrates suited for such objective, alumina was used in the early stage. Because of its calcining temperature as high as 1,500° C., alumina does not permit the use of a conductor having low melting point and resistance as a wiring metal, such as silver-palladium (Ag-Pd), silver (Ag), gold (Au) or copper (Cu) but requires the use of a conductor having a high melting point such as molybdenum (Mo) or tungsten (W). These high melting-point conductors however have high conductor resistance and the dielectric constant of alumina itself is a high as 9-10. It is therefore becoming increasing difficult to meet the speedup of LSIs. Further, the coefficient of thermal expansion of alumina is $7.5° \times 10^{-6}/°$ C., which is great compared to coefficients of thermal expansion of semiconductor elements (for example, $5° \times 10^{-6}/°$ C. for silicon), leading to problems such as a high rate of occurrence of connection failure between the substrates and their associated semiconductor elements. To overcome these problems, there is a strong demand for the provision of a raw batch for substrates which permit the use of a low-resistance conductor such as Ag-Pd, Ag, Au or Cu, lamination and simultaneous calcination at low temperatures. Some raw batches are known to be able to meet the above demand, including raw batches comprising $ZnO-B_2O_3$ glass, silicon dioxide and alumina and having a low dielectric constant (Japanese Patent Laid-Open No. 138357/1987), raw batches comprising glass powder, cordierite ($2MgO.2Al_2O_3.5SiO_2$), and quartz or silica glass (Japanese Patent Laid-Open No. 64957/1988 and No. 74957/1988), and raw batches comprising a glass composition crystallizable upon calcination, alumina and cordierite (Japanese Patent Laid-Open No. 95402/1989).

Although the conventional raw batches described above can meet the requirements that the resultant products have a low dielectric constant and low-temperature calcination is feasible, they cannot satisfy at the same time both the requirement for a lowered dielectric constant and the requirement for a coefficient of thermal expansion conforming with those of semiconductor elements.

SUMMARY OF THE INVENTION

An object of the present invention is to overcome the above-described problems and to provide a raw batch for ceramic substrates, which permits the use of a low resistance conductor such as Ag-Pd, Ag, Au or Cu and the production of substrates by low-temperature calcination and which can provide substrate products having a low dielectric constant and a coefficient of thermal expansion close to those of semiconductor elements.

The present inventors have prepared various raw batches for ceramic substrates and have proceeded with an extensive investigation on them. As a result, it has been found that a raw batch comprising borosilicate glass powder and aluminum borate powder at a specific ratio or a raw batch comprising borosilicate glass powder, aluminum borate powder and a particular oxide at a specific ratio permits the use of a low resistance conductor such as Ag-Pd, Ag, Au or Cu, can be calcined at low temperatures, and can provide ceramic substrates having a low dielectric constant and a coefficient of thermal expansion close to those of semiconductor elements, leading to the completion of the present invention.

In a first aspect of the present invention, there is thus provided a raw batch for ceramic substrates, comprising, as a mixture, 40 to 80 weight percent of borosilicate glass powder and 20 to 60 weight percent of aluminum borate powder More specifically, the raw batch for ceramic substrates, comprising, as a mixture:

40 to 80 weight percent of borosilicate glass powder, wherein borosilicate glass powder comprises, by weight, (a) 65 to 85 percent of silicon dioxide ($SiO_2$), (b) 5 to 25 percent of boric anhydride ($B_2O_3$), (c) 0.1 to 7 percent of at least one component selected from the group consisting of lithium oxide ($Li_2O$), sodium oxide ($Na_2O$) and potassium oxide ($K_2O$), (d) 0.1 to 5 percent of at least one component selected from the group consisting of magnesium oxide (MgO) and calcium oxide (CaO), and (e) 0.1 to 5 percent of alumina ($Al_2O_3$);

20 to 60 weight percent of aluminum borate powder which is in the form of fine powder ground to not greater than 3 μm in average particle size; and oxide compound which is at least one component selected from the group consisting of spinel, cordierite, mullite, forsterite, anorthite, celsian and alumina, there being up to and including 10 weight percent of the oxide compound.

In a second aspect of the present invention, there is also provided a process for the production of a ceramic substrate. The process comprises adding an inorganic and/or an organic vehicle to the raw batch and stirring the resultant mixture into a slurry, forming the slurry into green sheets of a predetermined thickness, forming a circuit pattern on the green sheets and laminating the thus-patterned green sheets in accordance with the shape and performance of a desired final product, and then calcining the thus-laminated green body at 900° to 1,000° C. More specifically, the process for the production of a ceramic substrate, which comprises:

adding a vehicle to a raw batch comprising a mixture of 40 to 80 weight percent of borosilicate glass powder, the borosilicate glass powder comprising, by weight, (a) 65 to 85 percent of silicon dioxide ($SiO_2$), (b) 5 to 25 percent of boric anhydride ($B_2O_3$), (c) 0.1 to 7 percent of at least one component selected from the group consisting essentially of lithium oxide ($Li_2O$), sodium oxide ($Na_2O$) and potassium oxide ($K_2O$), (d) 0.1 to 5 percent of at least one component selected from the group consisting of magnesium oxide (MgO) and calcium oxide (CaO), and (e) 0.1 to 5 percent of alumina ($Al_2O_3$), 20 to 60 weight percent of aluminum borate powder which is in the form of fine powder ground to not greater than 3 μm in average particle size, and oxide compound which is at least one component selected from the group consisting of alumina, spinel, cordierite, mullite, forsterite, anorthite and celsian, there being up to and including 10 weight percent of the oxide compound, and stirring the resultant mixture into a slurry;

forming the slurry into green sheets;

forming a circuit pattern on the green sheets and laminating the thus-patterned green sheets; and calcining the thus-laminated green body at 900° to 1000° C.

In a third aspect of the present invention, there is also provided a ceramic substrate produced by the above production process. The ceramic substrate is suited for the multilayer interconnection of LSIs.

DETAILED DESCRIPTION OF THE INVENTION

Preferred as the borosilicate glass powder in the present invention is that having the following composition: (1) 65 to 85 percent of silicon dioxide ($SiO_2$), (2) 5 to 25 percent of boric anhydride ($B_2O_3$), (3) 0.1 to 7 percent of at least one component selected from the group consisting of lithium oxide ($Li_2O$), sodium oxide ($Na_2O$) and potassium oxide ($K_2O$), (4) 0.1 to 5 percent of at least one component selected from the group consisting of magnesium oxide (MgO) and calcium oxide (CaO), and (5) 0.1 -5% of alumina ($Al_2O_3$), all by weight.

Although these glass components do not act as discrete components obviously, their proportions are limited to the above-described ranges, respectively, for the reasons to be described below.

Any proportion of $SiO_2$ smaller than 65 weight percent results in an unduly high dielectric constant and an excessively large coefficient of thermal expansion, while any proportion of $SiO_2$ greater than 85 wt. % leads to glass having a high softening point and hence to the need for a higher calcining temperature for substrates. Proportions outside the above-described range are therefore not preferred.

$B_2O_3$ acts as a flux. If its proportion is smaller than 5 weight percent, the softening point of the resulting glass become too high. If its proportion is greater than 25 wt. %, the softening point of the resulting glass becomes unduly low and, further, its moisture resistance is lowered. Proportions outside the above-specified range are accordingly not preferred.

Alkali metal oxides such as $Li_2O$, $Na_2O$ and $K_2O$ are added to improve the melting property upon production of glass. Any proportion smaller than 0.1 weight percent makes it difficult to draw their effects as needed. On the other hand, any proportion greater than 7 weight percent leads to deteriorations in electrical and thermal properties such as a high dielectric constant, a large coefficient of thermal expansion and lowered electrical insulating property. Proportions outside the above-specified range are therefore not preferred.

Like alkali metal oxides, MgO and CaO are also added to improve the melting property upon production of glass. Any proportion greater than 5 percent however results in an unduly high dielectric constant while any proportion smaller than 0.1 percent is too little to exhibit sufficient effect. Proportions outside the above-described range are thus not preferred.

$Al_2O_3$ is added to produce substrates with improved moisture resistance. Any proportion greater than 5 weight percent involves the potential problem that devitrification may take place upon production of glass. On the other hand, any proportion smaller than 0.1 percent is too little to bring about sufficient effect. Proportions outside the above-described range are accordingly not preferred.

Aluminum borate powder is added to impart sufficient strength to substrates. Usable as aluminum borate powder in the present invention is fine aluminum borate powder ground to an average particle size of 3 μm or smaller or aluminum borate whiskers formed with diameters of about 0.5-3.0 μm and lengths of about 10-200 μm.

As general chemical compositions for aluminum borate, $Al_{18}B_4O_{33}$, $Al_6B_8O_{21}$ and $Al_4B_2O_9$ are known. In the present invention, these compounds can be used either singly or in combination. When two or more of these compounds are used in combination, they can be added as a single composition or as separate compositions. In the latter case, the compounds can have different shapes. To impart sufficient strength to substrates, the use of whiskers is particularly preferred.

Based on the total amount of the mixture of aluminum borate powder, borosilicate powder, and a particular oxide compound the proportion of aluminum borate powder can be 20 to 60 weight percent preferably 30-60 wt. %.

If the proportion of aluminum borate powder exceeds 60 weight percent, the proportion of borosilicate glass powder becomes smaller. Accordingly, calcining at a temperature of 1,000° C. or lower cannot fully make aluminum borate wet. Pores are therefore formed in the resultant calcined body, thereby making it impossible to provide a dense body. Further, the dielectric constant of aluminum borate is approximately 6 so that the resulting substrates have a high dielectric constant. It is hence not preferred to use aluminum borate powder in such a large proportion. Any proportion of aluminum borate powder smaller than 20 weight percent leads to calcined bodies with reduced strength. Such a small proportion is therefore not preferred.

In the raw batch according to the present invention, it is possible to replace a part of aluminum borate powder by at least one component (hereinafter called "oxide compound") selected from the group consisting of alumina ($Al_2O_3$), spinel ($MgO.Al_2O_3$), cordierite (2MgO.-

2Al$_2$O$_3$.5SiO$_2$), mullite (3Al$_2$O$_3$.2SiO$_2$), forsterite (2MgO.SiO$_2$), anorthite (CaO.Al$_2$O$_3$.2SiO$_2$) and celsian (BaO.Al$_2$O$_3$.2SiO$_2$). However, if the amount of aluminum borate powder becomes too little, the balance between the dielectric constant and the coefficient of thermal expansion of the resulting substrates is impaired. It is therefore necessary to maintain the proportion of aluminum borate at 15 weight percent or greater in the raw batch. Similarly to aluminum borate powder, oxide compounds are effective in imparting strength to ceramic substrates. They can be used either singly or in combination.

The raw batch of the present invention, which is suitable for use in the production of ceramic substrates, can be prepared generally by mixing borosilicate glass powder ground to an average particle size of 3 μm or smaller, fine aluminum borate powder ground to an average particle size of 3 μm or smaller, aluminum borate whiskers whose diameters and lengths are in the ranges of about 0.5-3 μm and about 10-200μm respectively, and an oxide compound ground to an average particle size of 3 μm or smaller, in proportions within the respective ranges to give the total proportion of 100 wt. %.

Since the raw batch can be calcined at low temperatures, calcination and the formation of a multilayer structure can be conducted at the same time by using a low-resistance conductor such as Ag-Pd, Ag, Au or Cu.

To sinter the raw batch into substrates, a slurry prepared by adding water as an inorganic vehicle, or an organic vehicle to the raw batch and stirring them into an intimate mixture is formed green sheets of a predetermined thickness by the doctor blade method or the like. In accordance with the shape and performance of a desired final product, a circuit pattern is formed on the green sheets, and the thus-patterned green sheets are laminated. The thus-laminated green body is then calcined at 900°-1,000° C., thereby obtaining a ceramic substrate having a low dielectric constant and a small coefficient of thermal expansion.

The stirring of the raw batch or the mixing of the raw batch with water as an inorganic vehicle, or an organic vehicle can be effected by any conventional mixing method which is free from the potential problem of admixture of impurities, for example, by placing the raw batch alone or together with water or the organic vehicle in a polyethylene-made pot containing alumina-made balls and then rotating the pot. As an alternative, instead of mixing the components of the raw batch in advance, at least one powder selected from the group consisting of borosilicate glass powder, aluminum borate powder and the oxide compound can be mixed beforehand with water or an organic vehicle, to which the remaining components can then be added, followed by stirring.

The organic vehicle used here may comprise at least one organic vehicle selected from the group consisting solvents such as alcohols, toluene and methyl ethyl ketone, forming aids such as PVA (polyvinyl alcohol), PVB (polyvinyl butyral), ethylcellulose and acrylic resins, plasticizers such as dibutyl phthalate and benzyl butyl phthalate, and deflocculants such as diethylamine and tetramethylammonium hydroxide. Further, one or more inorganic vehicles such as sodium phosphate can also be used to extent not adversely affecting the performance of the product. Since the raw batch according to the present invention can be calcined at a temperature not higher than 1,000° C., a circuit or the like can be formed with a low resistance conductor such as Ag-Pd, Ag, Au or Cu on substrates while the substrates are still in the form of green sheets. The green sheets can then be calcined, if necessary, in a laminated form. Further, the ceramic substrates obtained using the raw batch have a low dielectric constant and a coefficient of thermal expansion close to those of semiconductor elements. Examples.

The present invention will hereinafter be described more specifically by the following examples, in which raw materials prepared in the following manner were used.

As borosilicate glass powder, a mixture whose composition consisted by weight of 78.5% of SiO$_2$ and 3.4% of B$_2$O$_3$, 0.11% of Al$_2$O$_3$, 0.39% of MgO, 0.03% of CaO, 0.007% of TiO$_2$ and the remainder of K$_2$O was ground to the average particle size of 3 μm. As aluminum borate powder, aluminum borate in the form of fine powder was prepared by mixing Al$_2$O$_3$ and B$_2$O$_3$ to give the composition of Al$_{18}$B$_4$O$_{33}$ or Al$_4$B$_2$O$_9$, subjecting the resultant mixture to heat treatment and then grinding it to the average particle size of 2 μm, or aluminum borate in the form of whiskers was prepared by forming aluminum borate, whose chemical composition was Al$_{18}$B$_4$O$_{33}$, into whiskers whose diameters and lengths ranged from 0.5 to 1.0 μm and from 10 to 30 μm, respectively. Oxide compounds were ground to the average particle size of 2 μm.

EXAMPLES 1-15 & COMPARATIVE EXAMPLES 1-8

In each of Examples 1-10 and Comparative Examples 1-4, borosilicate glass power and fine polycrystalline aluminum borate powder were weighed in the predetermined proportions in Table 1, followed by wet-mixing for 3 hours in an alumina-made ball mill. A slurry thus prepared was formed into green sheets. They were calcined at 950° C. for 5 hours in the surrounding atmosphere.

In each of Examples 11-15 and Comparative Examples 5 and 6, borosilicate glass powder and whisker-shaped aluminum borate were weighed in the predetermined proportions given in Table 1. Per 100 parts by weight of the mixed powder of borosilicate glass powder and Whisker-shaped aluminum borate, 14 parts by weight of an acrylic resin, 3 parts by weight of dibutyl phthalate, 32 parts by weight of toluene, 68 parts by weight of ethanol and 1 part of sorbitan monolaurate were weighed. They were mixed for 24 hours in a polyethylene pot which contained alumina-made balls, whereby a homogeneous slurry was prepared. From the slurry, green sheets of 0.2 mm in thickness were then formed by the doctor blade method. Twenty green sheets thus obtained were stacked (thickness: about 4 mm) and then bonded together under pressure into a test piece of 50×50 mm. The test piece was calcined at 950° C. for 3 hours in the surrounding atmosphere.

Properties of the resultant calcined body were measured by methods to be described below. The results are summarized in Table 1. The dielectric constant and dielectric loss tangent were measured at 20° C. and 1 MHz by a Q-meter, and the signal propagation delay time ($T_{pd}$) was calculated in accordance with the following formula:

$$T_{pd} = \sqrt{\epsilon} / C \text{ (ns/m)}$$

where
C: light velocity, and
ns/m: nanosecond/meter.

The shorter the signal propagation delay time, in other words, the lower the dielectric constant ($\epsilon$), the faster the signal propagation velocity.

The coefficient of thermal expansion was measured at room temperature to 400° C. by means of a quartz differential thermodilatometer.

The bending strength was measured following the Japanese Industrial Standard (JIS) R1601.

As is apparent from the results shown in Table 1, the dielectric constant of the calcined body obtained from each of the raw batches of the present invention was lower by 30-40% compared to those of the conventional alumina substrate and composite alumina-glass substrate shown under Comparative Example 7 and Comparative Example 8, respectively. As a result, the signal propagation delay time was shortened to 6.8-7.5 ns/m and, in addition, the coefficient of thermal expansion was close to those of semiconductor elements. The dielectric loss tangent ranged from $11 \times 10^{-4}$ to $17 \times 10^{-4}$.

In each of Comparative Examples 1, 3 and 5, the properties of the calcined body were affected by the properties of borosilicate glass powder due to the high proportion of borosilicate glass powder so that the calcined body failed to exhibit high strength. In each of Comparative Examples 2, 4 and 6, pores were observed in the surfaces of the resultant calcined body so that the calcined body was not preferred.

EXAMPLES 16-30 & COMPARATIVE EXAMPLES 9-14

In each of the examples and comparative examples, borosilicate glass powder, aluminum borate powder (fine powder or whiskers) and the oxide compound(s) were weighed in the predetermined proportions shown in Table 2. The raw batch so proportioned was then processed and treated similarly to Examples 11-15. It is envisaged from Table 2 that the data of the properties of the resultant calcined bodies were substantially comparable with the data of the properties of the calcined bodies obtained in the corresponding examples in which no oxide compound was used, the latter data being shown in Table 1. Further, as is understood from Comparative Examples 9-14, a proportion of aluminum borate smaller than 15% results in a smaller coefficient of thermal expansion and reduced bending strength, whereby the object of the present invention cannot be fulfilled. In addition, a proportion of borosilicate glass smaller than 40 wt. % can give high bending strength owing to the effects of aluminum borate and the oxide compound(s) but leads to a reduced relative density.

EXAMPLES 31-123 & COMPARATIVE EXAMPLES 15-20

In each of the examples and comparative examples, borosilicate glass powder, aluminum borate powder (fine powder or whiskers) and the oxide compound(s) were weighed in the predetermined proportions shown in the corresponding one of Tables 3-8. The raw batch so proportioned was then processed and treated similarly to Examples 11-15. It is envisaged from Tables 3-8 that the data of the properties of the resultant calcined bodies were substantially comparable with the data of the properties of the calcined bodies obtained in the corresponding examples in which no oxide compound was used, the latter data being shown in Table 1. Further, as is understood from Comparative Examples 15-20, a proportion of aluminum borate smaller than 15% results in a reduced bending strength, whereby the object of the present invention cannot be fulfilled. In addition, a proportion of borosilicate glass smaller than 40 wt. % can give high bending strength owing to the effects of aluminum borate and the oxide compound(s) but leads to a reduced relative density.

The raw batches according to the present invention can be calcined at a temperature not higher than 1,000° C., so that a low-resistance conductor such as Ag-Pd, Ag, Au or Cu can be used. Ceramic substrates obtained from these raw batches have a low dielectric constant and their coefficients of thermal expansion are close to those of semiconductor elements. The present invention can therefore contribute to the speedup of LSIs, high-density mounting and improved reliability.

TABLE 1

| | $Al_{18}B_4O_{33}$ (wt. %) | $Al_4B_2O_9$ (wt. %) | Glass (wt. %) | Calcination temp. (°C.) | Relative density (%) | Bending strength (kgf/cm$^2$) | Dielectric constant | Thermal expansion coefficient ($\times 10^{-6}$/°C.) | Delay time (ns/m) | Dielectric loss tangent ($\times 10^{-4}$) |
|---|---|---|---|---|---|---|---|---|---|---|
| Ex. 1 | Fine powder 20 | | 80 | 950 | 94 | 820 | 4.2 | 2.8 | 6.8 | 15 |
| Ex. 2 | Fine powder 30 | | 70 | 950 | 98 | 1490 | 4.5 | 3.3 | 7.1 | 16 |
| Ex. 3 | Fine powder 40 | | 60 | 950 | 97 | 1700 | 4.6 | 3.6 | 7.1 | 11 |
| Ex. 4 | Fine powder 50 | | 50 | 950 | 97 | 1930 | 4.7 | 3.6 | 7.2 | 15 |
| Ex. 5 | Fine powder 60 | | 40 | 950 | 97 | 1680 | 4.9 | 3.7 | 7.4 | 16 |
| Ex. 6 | | Fine powder 20 | 80 | 950 | 93 | 820 | 4.3 | 3.2 | 6.9 | 16 |
| Ex. 7 | | Fine powder 30 | 70 | 950 | 98 | 1550 | 4.5 | 3.6 | 7.1 | 11 |
| Ex. 8 | | Fine powder 40 | 60 | 950 | 98 | 1740 | 4.7 | 4.0 | 7.2 | 11 |
| Ex. 9 | | Fine powder 50 | 50 | 950 | 98 | 1970 | 4.9 | 4.4 | 7.4 | 11 |
| Ex. 10 | | Fine powder 60 | 40 | 950 | 96 | 1800 | 5.1 | 4.6 | 7.5 | 11 |
| Ex. 11 | Whiskers 20 | | 80 | 950 | 94 | 830 | 4.1 | 2.5 | 6.7 | 16 |
| Ex. 12 | Whiskers 30 | | 70 | 950 | 97 | 1500 | 4.3 | 2.9 | 6.9 | 17 |
| Ex. 13 | Whiskers 40 | | 60 | 950 | 97 | 1740 | 4.4 | 3.2 | 7.0 | 14 |
| Ex. 14 | Whiskers 50 | | 50 | 950 | 97 | 2070 | 4.5 | 3.3 | 7.1 | 14 |
| Ex. 15 | Whiskers 60 | | 40 | 950 | 92 | 1600 | 4.4 | 3.3 | 7.0 | 16 |
| Comp. Ex. 1 | Fine powder 10 | | 90 | 950 | 92 | 600 | 4.1 | 2.6 | 6.7 | 20 |
| Comp. Ex. 2 | Fine powder 70 | | 30 | 950 | 88 | 1330 | | | | |
| Comp. Ex. 3 | | Fine powder 10 | 90 | 950 | 92 | 590 | 4.1 | 2.8 | 6.7 | 20 |

TABLE 1-continued

| | $Al_{18}B_4O_{33}$ (wt. %) | $Al_4B_2O_9$ (wt. %) | Glass (wt. %) | Calcination temp. (°C.) | Relative density (%) | Bending strength (kgf/cm²) | Dielectric constant | Thermal expansion coefficient ($\times 10^{-6}$/°C.) | Delay time (ns/m) | Dielectric loss tangent ($\times 10^{-4}$) |
|---|---|---|---|---|---|---|---|---|---|---|
| Comp. Ex. 4 | | Fine powder 70 | 30 | 950 | 87 | 1160 | | | | |
| Comp. Ex. 5 | Whiskers 10 | | 90 | 950 | 90 | 620 | 3.9 | 2.5 | 6.5 | 20 |
| Comp. Ex. 6 | Whiskers 70 | | 30 | 950 | 87 | 1420 | | | | |
| Comp. Ex. 7 | 99.5 wt. % $Al_2O_3$ | | | 1500 | | | 9.7 | 8.0 | 10.4 | 1 |
| Comp. Ex. 8 | 50 wt. % $Al_2O_3$-50 wt. % glass | | | 950 | | | 7.5 | 4.2 | 9.1 | 15 |

(note) "Glass (wt. %)" indicates the wt. % of borosilicate glass powder.

TABLE 2

| | $Al_{18}$ (wt. %) | $Al_4$ (wt. %) | Oxide compound | | | | | | | Glass (wt. %) | Relative density (%) | Bending strength (kgf/cm²) | Dielectric constant | Thermal expansion coefficient ($\times 10^{-6}$/°C.) | Delay time (ns/m) | Dielectric loss tangent ($\times 10^{-4}$) |
|---|---|---|---|---|---|---|---|---|---|---|---|---|---|---|---|---|
| | | | AL | SP | MU | CO | FO | AN | CE | | | | | | | |
| Ex. 16 | PO15 | | 5 | | | | | | | 80 | 94 | 910 | 4.4 | 3.1 | 7.0 | 11 |
| Ex. 17 | PO20 | | | | 10 | | | | | 70 | 97 | 1490 | 4.5 | 3.4 | 7.1 | 15 |
| Ex. 18 | PO30 | | | | | 5 | | 5 | | 60 | 97 | 1690 | 4.5 | 3.6 | 7.1 | 21 |
| Ex. 19 | PO40 | | | | | 5 | 5 | | | 50 | 95 | 1900 | 4.4 | 4.0 | 7.0 | 19 |
| Ex. 20 | PO50 | | | | | 5 | | | 5 | 40 | 94 | 1800 | 4.8 | 3.7 | 7.3 | 21 |
| Ex. 21 | WH15 | | | 5 | | | | | | 80 | 94 | 890 | 4.4 | 2.6 | 7.0 | 13 |
| Ex. 22 | WH25 | | | | 5 | | | | | 70 | 97 | 1410 | 4.1 | 2.9 | 6.7 | 15 |
| Ex. 23 | WH30 | | | | 10 | | | | | 60 | 96 | 1740 | 4.3 | 3.4 | 6.9 | 16 |
| Ex. 24 | WH40 | | | | | 5 | 5 | | | 50 | 95 | 1960 | 4.2 | 3.8 | 6.8 | 20 |
| Ex. 25 | WH50 | | | 5 | | 5 | | | | 40 | 92 | 1690 | 4.7 | 3.5 | 7.2 | 22 |
| Ex. 26 | | PO15 | | | | | | | 5 | 80 | 94 | 830 | 4.4 | 3.2 | 7.0 | 13 |
| Ex. 27 | | PO25 | | | 5 | | | | | 70 | 96 | 1500 | 4.6 | 3.5 | 7.1 | 11 |
| Ex. 28 | | PO35 | | | | 5 | | | | 60 | 98 | 1730 | 4.6 | 3.8 | 7.1 | 21 |
| Ex. 29 | | PO40 | 5 | | | 5 | | | | 50 | 97 | 1980 | 4.9 | 4.3 | 7.4 | 19 |
| Ex. 30 | | PO50 | | | | 5 | | 5 | | 40 | 96 | 1690 | 5.1 | 4.6 | 7.6 | 20 |
| Comp. Ex. 9 | PO5 | | | | 5 | | | | | 90 | 90 | 600 | 4.1 | 2.7 | 6.7 | 20 |
| Comp. Ex. 10 | PO65 | | | | 5 | | | | | 30 | 89 | 1190 | | | | |
| Comp. Ex. 11 | WH5 | | | | 5 | | | | | 90 | 90 | 590 | 4.1 | 2.5 | 6.7 | 19 |
| Comp. Ex. 12 | WH65 | | | 5 | | | | | | 30 | 88 | 1370 | | | | |
| Comp. Ex. 13 | | PO5 | | 5 | | | | | | 90 | 89 | 610 | 4.0 | 2.7 | 6.7 | 19 |
| Comp. Ex. 14 | | PO65 | | | | 5 | | | | 30 | 89 | 1410 | | | | |

(Note) The abbreviations in the table have the following meanings and "Glass (wt. %)" means the wt. % of borosilicate glass powder.
$Al_{18}$: $Al_{18}B_4O_{33}$
$Al_4$: $Al_4B_2O_9$
AL: Alumina
SP: Spinel
MU: Mullite
CO: Cordierite
FO: Forsterite
AN: Anorthite
CE: Celsian
Glass: Borosilicate glass powder.
PO: Fine powder
WH: Whiskers

TABLE 3

| | $Al_{18}O_4O_{33}$ (wt. %) | $Al_4B_2O_9$ (wt. %) | AL wt. % | SP wt. % | MU wt. % | CO wt. % | FO wt. % | AN wt. % | CE wt. % | Glass (wt. %) | Relative density (%) | Bending strength (kgf/cm²) | Dielectric constant | Thermal expansion coefficient ($\times 10^{-6}$/°C.) | Delay time (ns/m) |
|---|---|---|---|---|---|---|---|---|---|---|---|---|---|---|---|
| Ex. 31 | Powder 15 | | | 5 | | | | | | 80 | 93 | 880 | 4.4 | 3.0 | 7.0 |
| Ex. 32 | Powder 15 | | | | 5 | | | | | 80 | 94 | 890 | 4.2 | 2.8 | 6.8 |
| Ex. 33 | Powder 15 | | | | | 5 | | | | 80 | 94 | 880 | 4.1 | 2.6 | 6.7 |
| Ex. 34 | Powder 15 | | | | | | 5 | | | 80 | 92 | 880 | 4.2 | 3.2 | 6.8 |
| Ex. 35 | Powder 15 | | | | | | | 5 | | 80 | 94 | 870 | 4.3 | 2.9 | 6.9 |
| Ex. 36 | Powder 15 | | | | | | | | 5 | 80 | 94 | 880 | 4.3 | 2.9 | 6.9 |
| Ex. 37 | Powder 25 | | | | 5 | | | | | 70 | 97 | 1410 | 4.4 | 3.3 | 7.0 |
| Ex. 38 | Powder 25 | | | | | 5 | | | | 70 | 96 | 1430 | 4.3 | 3.1 | 6.9 |

TABLE 3-continued

| | Al$_{18}$O$_4$O$_{33}$ (wt. %) | Al$_4$B$_2$O$_9$ (wt. %) | AL wt. % | SP wt. % | MU wt. % | CO wt. % | FO wt. % | AN wt. % | CE wt. % | Glass (wt. %) | Relative density (%) | Bending strength (kgf/cm$^2$) | Dielectric constant | Thermal expansion coefficient ($\times 10^{-6}/°C$) | Delay time (ns/m) |
|---|---|---|---|---|---|---|---|---|---|---|---|---|---|---|---|
| Ex. 39 | Powder 20 | | | | | 10 | | | | 70 | 97 | 1470 | 4.2 | 2.9 | 6.8 |
| Ex. 40 | Powder 35 | | | | 5 | | | | | 60 | 98 | 1690 | 4.4 | 3.6 | 7.0 |
| Ex. 41 | Powder 35 | | | | | 5 | | | | 60 | 97 | 1660 | 4.4 | 3.5 | 7.0 |
| Ex. 42 | Powder 30 | | | | 10 | | | | | 60 | 97 | 1730 | 4.5 | 3.7 | 7.1 |
| Ex. 43 | Powder 30 | | | | | 10 | | | | 60 | 97 | 1730 | 4.3 | 3.3 | 6.9 |
| Ex. 44 | Powder 30 | | 5 | | | 5 | | | | 60 | 96 | 1760 | 4.5 | 3.7 | 7.1 |
| Ex. 45 | Powder 30 | | | 5 | | 5 | | | | 60 | 95 | 1690 | 4.5 | 3.7 | 7.1 |
| Ex. 46 | Powder 30 | | | | | 5 | 5 | | | 60 | 96 | 1700 | 4.3 | 3.7 | 6.9 |
| Ex. 47 | Powder 30 | | | | | 5 | | | 5 | 60 | 96 | 1700 | 4.4 | 3.6 | 7.0 |
| Ex. 48 | Powder 45 | | | | 5 | | | | | 50 | 97 | 1960 | 4.5 | 3.6 | 7.1 |

Glass: Borosilicate glass, AL: Alumina, SP: Spinel, MU: Mullite, CO: Cordierite, FO: Forsterite, AN: Anorthite, CE: Celsian.

TABLE 4

| | Al$_{18}$O$_4$O$_{33}$ (wt. %) | Al$_4$B$_2$O$_9$ (wt. %) | AL wt. % | SP wt. % | MU wt. % | CO wt. % | FO wt. % | AN wt. % | CE wt. % | Glass (wt. %) | Relative density (%) | Bending strength (kgf/cm$^2$) | Dielectric constant | Thermal expansion coefficient ($\times 10^{-6}/°C$) | Delay time (ns/m) |
|---|---|---|---|---|---|---|---|---|---|---|---|---|---|---|---|
| Ex. 49 | Powder 45 | | | | | 5 | | | | 50 | 96 | 1900 | 4.4 | 3.4 | 7.0 |
| Ex. 50 | Powder 40 | | | | 10 | | | | | 50 | 97 | 1980 | 4.6 | 3.8 | 7.1 |
| Ex. 51 | Powder 40 | | | | | 10 | | | | 50 | 97 | 1900 | 4.3 | 3.2 | 6.9 |
| Ex. 52 | Powder 40 | | 5 | | | 5 | | | | 50 | 96 | 1930 | 4.7 | 3.9 | 7.2 |
| Ex. 53 | Powder 40 | | | 5 | | 5 | | | | 50 | 95 | 1880 | 4.6 | 3.8 | 7.1 |
| Ex. 54 | Powder 40 | | | | | 5 | | 5 | | 50 | 97 | 1890 | 4.6 | 3.7 | 7.1 |
| Ex. 55 | Powder 40 | | | | | 5 | | | 5 | 50 | 97 | 1910 | 4.5 | 3.8 | 7.1 |
| Ex. 56 | Powder 50 | | | | 10 | | | | | 40 | 94 | 1710 | 5.0 | 3.9 | 7.5 |
| Ex. 57 | Powder 50 | | | | | 10 | | | | 40 | 96 | 1680 | 4.5 | 3.4 | 7.1 |
| Ex. 58 | Powder 50 | | 5 | | | 5 | | | | 40 | 95 | 1710 | 5.1 | 3.9 | 7.6 |
| Ex. 59 | Powder 50 | | | 5 | | 5 | | | | 40 | 94 | 1630 | 4.9 | 3.9 | 7.4 |
| Ex. 60 | Powder 50 | | | | | 5 | 5 | | | 40 | 95 | 1610 | 4.7 | 4.1 | 7.2 |
| Ex. 61 | Powder 50 | | | | | 5 | | 5 | | 40 | 95 | 1570 | 4.8 | 3.8 | 7.3 |
| Comp. Ex. 15 | Powder 5 | | | | | 5 | | | | 90 | 89 | 610 | | | |
| Comp. Ex. 16 | Powder 65 | | | | 5 | | | | | 30 | 88 | 1250 | | | |

Glass: Borosilicate glass, AL: Alumina, SP: Spinel, MU: Mullite, CO: Cordierite, FO: Forsterite, AN: Anorthite, CE: Celsian.

TABLE 5

| | Al$_{18}$O$_4$O$_{33}$ (wt. %) | Al$_4$B$_2$O$_9$ (wt. %) | AL wt. % | SP wt. % | MU wt. % | CO wt. % | FO wt. % | AN wt. % | CE wt. % | Glass (wt. %) | Relative density (%) | Bending strength (kgf/cm$^2$) | Dielectric constant | Thermal expansion coefficient ($\times 10^{-6}/°C$) | Delay time (ns/m) |
|---|---|---|---|---|---|---|---|---|---|---|---|---|---|---|---|
| Ex. 62 | Whiskers 15 | | 5 | | | | | | | 80 | 93 | 910 | 4.3 | 2.8 | 6.9 |
| Ex. 63 | Whiskers 15 | | | 5 | | | | | | 80 | 94 | 910 | 4.1 | 2.6 | 6.7 |
| Ex. 64 | Whiskers 15 | | | | | 5 | | | | 80 | 93 | 880 | 4.0 | 2.5 | 6.7 |
| Ex. 65 | Whiskers 15 | | | | | | 5 | | | 80 | 92 | 890 | 4.1 | 2.9 | 6.7 |
| Ex. 66 | Whiskers 15 | | | | | | | 5 | | 80 | 93 | 880 | 4.1 | 2.6 | 6.7 |
| Ex. 67 | Whiskers 15 | | | | | | | | 5 | 80 | 94 | 880 | 4.2 | 2.6 | 6.8 |
| Ex. 68 | Whiskers 25 | | | | 5 | | | | | 70 | 97 | 1410 | 4.3 | 2.9 | 6.9 |
| Ex. 69 | Whiskers 20 | | | | 10 | | | | | 70 | 96 | 1510 | 4.4 | 3.0 | 7.0 |
| Ex. 70 | Whiskers 20 | | | | | 10 | | | | 70 | 97 | 1470 | 4.0 | 2.9 | 6.7 |
| Ex. 71 | Whiskers 35 | | | | 5 | | | | | 60 | 97 | 1730 | 4.2 | 3.3 | 6.8 |
| Ex. 72 | Whiskers 35 | | | | | 5 | | | | 60 | 97 | 1690 | 4.2 | 3.3 | 6.8 |
| Ex. 73 | Whiskers 30 | | | | | 10 | | | | 60 | 97 | 1710 | 4.1 | 3.1 | 6.7 |
| Ex. 74 | Whiskers 30 | | 5 | | | 5 | | | | 60 | 96 | 1770 | 4.4 | 3.2 | 7.0 |
| Ex. 75 | Whiskers 30 | | | 5 | | 5 | | | | 60 | 96 | 1720 | 4.3 | 3.3 | 6.9 |
| Ex. 76 | Whiskers | | | | | 5 | 5 | | | 60 | 95 | 1700 | 4.1 | 3.3 | 6.7 |

TABLE 5-continued

| | $Al_{18}O_4O_{33}$ (wt. %) | $Al_4B_2O_9$ (wt. %) | AL wt. % | SP wt. % | MU wt. % | CO wt. % | FO wt. % | AN wt. % | CE wt. % | Glass (wt. %) | Relative density (%) | Bending strength (kgf/cm²) | Dielectric constant | Thermal expansion coefficient (× 10⁻⁶/°C.) | Delay time (ns/m) |
|---|---|---|---|---|---|---|---|---|---|---|---|---|---|---|---|
| Ex. 77 | Whiskers 30 | | | | | 5 | 5 | | | 60 | 95 | 1700 | 4.3 | 3.3 | 6.9 |
| Ex. 78 | Whiskers 30 | | | | | 5 | | | 5 | 60 | 96 | 1720 | 4.2 | 3.3 | 6.8 |
| Ex. 79 | Whiskers 45 | | | | 5 | | | | | 50 | 97 | 2070 | 4.3 | 3.2 | 6.9 |

Glass: Borosilicate glass, AL: Alumina, SP: Spinel, MU: Mullite, CO: Cordierite, FO: Forsterite, AN: Anorthite, CE: Celsian.

TABLE 6

| | $Al_{18}O_4O_{33}$ (wt. %) | $Al_4B_2O_9$ (wt. %) | AL wt. % | SP wt. % | MU wt. % | CO wt. % | FO wt. % | AN wt. % | CE wt. % | Glass (wt. %) | Relative density (%) | Bending strength (kgf/cm²) | Dielectric constant | Thermal expansion coefficient (× 10⁻⁶/°C.) | Delay time (ns/m) |
|---|---|---|---|---|---|---|---|---|---|---|---|---|---|---|---|
| Ex. 80 | Whiskers 45 | | | | | 5 | | | | 50 | 97 | 2020 | 4.3 | 3.1 | 6.9 |
| Ex. 81 | Whiskers 40 | | | | 10 | | | | | 50 | 97 | 2070 | 4.5 | 3.5 | 7.1 |
| Ex. 82 | Whiskers 40 | | | | | 10 | | | | 50 | 96 | 1990 | 4.1 | 3.0 | 6.7 |
| Ex. 83 | Whiskers 40 | | 5 | | | 5 | | | | 50 | 97 | 2000 | 4.6 | 3.6 | 7.1 |
| Ex. 84 | Whiskers 40 | | | 5 | | 5 | | | | 50 | 95 | 1990 | 4.4 | 3.6 | 7.0 |
| Ex. 85 | Whiskers 40 | | | | | 5 | 5 | | | 50 | 96 | 1970 | 4.4 | 3.4 | 7.0 |
| Ex. 86 | Whiskers 40 | | | | | 5 | | | 5 | 50 | 90 | 1950 | 4.3 | 3.5 | 6.9 |
| Ex. 87 | Whiskers 50 | | | | 10 | | | | | 40 | 93 | 1680 | 4.7 | 3.5 | 7.2 |
| Ex. 88 | Whiskers 50 | | | | | 10 | | | | 40 | 94 | 1640 | 4.3 | 3.0 | 6.9 |
| Ex. 89 | Whiskers 50 | | 5 | | | 5 | | | | 40 | 93 | 1730 | 4.6 | 3.6 | 7.1 |
| Ex. 90 | Whiskers 50 | | | | | 5 | 5 | | | 40 | 94 | 1630 | 4.5 | 3.7 | 7.1 |
| Ex. 91 | Whiskers 50 | | | | | 5 | | 5 | | 40 | 93 | 1590 | 4.5 | 3.5 | 7.1 |
| Ex. 92 | Whiskers 50 | | | | | 5 | | | 5 | 40 | 93 | 1590 | 4.4 | 3.5 | 7.0 |
| Comp. Ex. 17 | Whiskers 5 | | | | 5 | | | | | 90 | 90 | 600 | | | |
| Comp. Ex. 18 | Whiskers 65 | | | | | 5 | | | | 30 | 87 | 1360 | | | |

Glass: Borosilicate glass, AL: Alumina, SP: Spinel, MU: Mullite, CO: Cordierite, FO: Forsterite, AN: Anorthite, CE: Celsian.

TABLE 7

| | $Al_{18}O_4O_{33}$ (wt. %) | $Al_4B_2O_9$ (wt. %) | AL wt. % | SP wt. % | MU wt. % | CO wt. % | FO wt. % | AN wt. % | CE wt. % | Glass (wt. %) | Relative density (%) | Bending strength (kgf/cm²) | Dielectric constant | Thermal expansion coefficient (× 10⁻⁶/°C.) | Delay time (ns/m) |
|---|---|---|---|---|---|---|---|---|---|---|---|---|---|---|---|
| Ex. 93 | | Powder 15 | 5 | | | | | | | 80 | 94 | 870 | 4.5 | 3.2 | 7.1 |
| Ex. 94 | | Powder 15 | | 5 | | | | | | 80 | 93 | 820 | 4.5 | 3.2 | 7.1 |
| Ex. 95 | | Powder 15 | | | 5 | | | | | 80 | 93 | 830 | 4.2 | 3.1 | 6.8 |
| Ex. 96 | | Powder 15 | | | | 5 | | | | 80 | 93 | 830 | 4.4 | 2.9 | 7.0 |
| Ex. 97 | | Powder 15 | | | | | 5 | | | 80 | 93 | 820 | 4.4 | 3.5 | 7.0 |
| Ex. 98 | | Powder 15 | | | | | | 5 | | 80 | 92 | 810 | 4.5 | 3.2 | 7.1 |
| Ex. 99 | | Powder 25 | | | | 5 | | | | 70 | 97 | 1510 | 4.5 | 3.4 | 7.1 |
| Ex. 100 | | Powder 20 | | | 10 | | | | | 70 | 97 | 1570 | 4.6 | 3.7 | 7.1 |
| Ex. 101 | | Powder 20 | | | | 10 | | | | 70 | 97 | 1550 | 4.4 | 3.3 | 7.0 |
| Ex. 102 | | Powder | | 5 | | | | | | 60 | 97 | 1740 | 4.5 | 4.0 | 7.1 |

TABLE 7-continued

| | $Al_{18}O_4O_{33}$ (wt. %) | $Al_4B_2O_9$ (wt. %) | AL wt. % | SP wt. % | MU wt. % | CO wt. % | FO wt. % | AN wt. % | CE wt. % | Glass (wt. %) | Relative density (%) | Bending strength (kgf/cm²) | Dielectric constant | Thermal expansion coefficient (× 10⁻⁶/°C.) | Delay time (ns/m) |
|---|---|---|---|---|---|---|---|---|---|---|---|---|---|---|---|
| Ex. 103 | | Powder 35 30 | | | 10 | | | | | 60 | 97 | 1750 | 4.7 | 4.1 | 7.2 |
| Ex. 104 | | Powder 30 | | | | 10 | | | | 60 | 97 | 1760 | 4.5 | 3.6 | 7.1 |
| Ex. 105 | | Powder 30 | 5 | | | 5 | | | | 60 | 96 | 1780 | 4.6 | 4.0 | 7.1 |
| Ex. 106 | | Powder 30 | | 5 | | 5 | | | | 60 | 96 | 1760 | 4.6 | 4.1 | 7.1 |
| Ex. 107 | | Powder 30 | | | | 5 | 5 | | | 60 | 97 | 1760 | 4.5 | 4.0 | 7.1 |
| Ex. 108 | | Powder 30 | | | | 5 | | 5 | | 60 | 96 | 1750 | 4.6 | 4.0 | 7.1 |
| Ex. 109 | | Powder 30 | | | | 5 | | | 5 | 60 | 97 | 1760 | 4.5 | 4.0 | 7.1 |
| Ex. 110 | | Powder 45 | | | 5 | | | | | 50 | 97 | 1970 | 4.7 | 4.3 | 7.2 |

Glass: Borosilicate glass, AL: Alumina, SP: Spinel, MU: Mullite, CO: Cordierite, FO: Forsterite, AN: Anorthite, CE: Celsian.

TABLE 8

| | $Al_{18}O_4O_{33}$ (wt. %) | $Al_4B_2O_9$ (wt. %) | AL wt. % | SP wt. % | MU wt. % | CO wt. % | FO wt. % | AN wt. % | CE wt. % | Glass (wt. %) | Relative density (%) | Bending strength (kgf/cm²) | Dielectric constant | Thermal expansion coefficient (× 10⁻⁶/°C.) | Delay time (ns/m) |
|---|---|---|---|---|---|---|---|---|---|---|---|---|---|---|---|
| Ex. 111 | | Powder 45 | | | | 5 | | | | 50 | 97 | 1950 | 4.6 | 4.1 | 7.1 |
| Ex. 112 | | Powder 40 | | | 10 | | | | | 50 | 97 | 1990 | 4.7 | 4.1 | 7.2 |
| Ex. 113 | | Powder 40 | | | | 10 | | | | 50 | 96 | 1950 | 4.5 | 3.7 | 7.1 |
| Ex. 114 | | Powder 40 | | 5 | | 5 | | | | 50 | 96 | 1950 | 4.8 | 4.2 | 7.3 |
| Ex. 115 | | Powder 40 | | | | 5 | 5 | | | 50 | 96 | 1940 | 4.5 | 4.5 | 7.1 |
| Ex. 116 | | Powder 40 | | | | 5 | | 5 | | 50 | 95 | 1960 | 4.7 | 4.1 | 7.2 |
| Ex. 117 | | Powder 40 | | | | 5 | | | 5 | 50 | 95 | 1960 | 4.5 | 4.1 | 7.1 |
| Ex. 118 | | Powder 50 | | | 10 | | | | | 40 | 95 | 1750 | 5.1 | 4.6 | 7.6 |
| Ex. 119 | | Powder 50 | | | | 10 | | | | 40 | 94 | 1700 | 4.5 | 3.9 | 7.1 |
| Ex. 120 | | Powder 50 | 5 | | | 5 | | | | 40 | 94 | 1710 | 5.2 | 4.6 | 7.6 |
| Ex. 121 | | Powder 50 | | 5 | | 5 | | | | 40 | 94 | 1690 | 5.1 | 4.6 | 7.6 |
| Ex. 122 | | Powder 50 | | | | 5 | 5 | | | 40 | 95 | 1700 | 4.9 | 4.8 | 7.4 |
| Ex. 123 | | Powder 50 | | | | 5 | | | 5 | 40 | 96 | 1690 | 5.1 | 4.5 | 7.6 |
| Comp. Ex. 19 | | Powder 5 | | | | 5 | | | | 90 | 88 | 590 | | | |
| Comp. Ex. 20 | | Powder 65 | | | 5 | | | | | 30 | 87 | 1490 | | | |

Glass: Borosilicate glass, AL: Alumina, SP: Spinel, MU: Mullite, CO: Cordierite, FO: Forsterite, AN: Anorthite, CE: Celsian.

What is claimed is:

1. A raw batch for ceramic substrates, comprising, as a mixture:

40 to 80 weight percent of borosilicate glass powder, wherein borosilicate glass powder comprises, by weight, (a) 65 to 85 percent of silicon dioxide ($SiO_2$), (b) 5 to 25 percent of boric anhydride ($B_2O_3$), (c) 0.1 to 7 percent of at least one component selected from the group consisting of lithium oxide ($Li_2O$), sodium oxide ($Na_2O$) and potassium oxide ($K_2O$), (d) 0.1 to 5 percent of at least one component selected from the group consisting of magnesium oxide (MgO) and calcium oxide (CaO), and (e) 0.1 to 5 percent of alumina ($Al_2O_3$);

20 to 60 weight percent of aluminum borate powder which is in the form of fine powder ground to not greater than 3 μm in average particle size; and oxide compound which is at least one component selected from the group consisting of spinel, cordierite, mullite, forsterite, anorthite, celsian and alumina, there being an amount of up to and including 10 weight percent of the oxide compound.

2. The raw batch of claim 1 wherein the aluminum borate powder is at least one compound selected from the group consisting of $Al_{18}B_4O_{33}$, $Al_6B_8O_{21}$ and $Al_4B_2O_9$.

3. A process for the production of a ceramic substrate, which comprises:

adding a vehicle to a raw batch comprising a mixture of 40 to 80 weight percent of borosilicate glass powder, the borosilicate glass powder comprising, by weight, (a) 65 to 85 percent of silicon dioxide ($SiO_2$), (b) 5 to 25 percent of boric anhydride ($B_2O_3$), (c) 0.1 to 7 percent of at least one component selected from the group consisting essentially of lithium oxide ($Li_2O$), sodium oxide ($Na_2O$) and potassium oxide ($K_2O$), (d) 0.1 to 5 percent of at least one component selected from the group consisting of magnesium oxide (MgO) and calcium oxide (CaO), and (e) 0.1 to 5 percent of alumina ($Al_2O_3$), 20 to 60 weight percent of aluminum borate powder which is in the form of fine powder ground to not greater than 3 $\mu$m in average particle size, and oxide compound which is at least one component selected from the group consisting of alumina, spinel, cordierite, mullite, forsterite, anorthite and celsian, there being an amount of up to and including 10 weight percent of the oxide compound, and stirring the resultant mixture into a slurry;

forming the slurry into green sheets;

forming a circuit pattern on the green sheets and laminating the thus-patterned green sheets; and calcining the thus-laminated green body at 900°$\pi$to 100° C.

4. The process of claim 3 wherein the aluminum borate powder is at least one compound selected from the group consisting of $Al_{18}B_4O_{33}$, $Al_6B_8O_{21}$ and $Al_4B_2O_9$.

5. The process of claim 4 wherein the vehicle comprises at least one compound selected from the group consisting of water, alcohols, toluene, methyl ethyl ketone, PVA (polyvinyl alcohol), PVB (polyvinyl butyral), ethylcellulose, acrylic resins, dibutyl phthalate, benzyl butyl phthalate, diethylamine, tetramethylammonium hydroxide and sodium phosphate.

6. The process of claim 3 wherein the vehicle comprises at least one compound selected from the group consisting of water, alcohols, toluene, methyl ethyl ketone, PVA (polyvinyl alcohol), PVB (polyvinyl butyral), ethylcellulose, acrylic resins, dibutyl phthalate, benzyl butyl phthalate, diethylamine, tetramethylammonium hydroxide and sodium phosphate.

7. A ceramic substrate produced by the process of any one of claim 3 to 6.

* * * * *